United States Patent [19]
Frye et al.

[11] 3,781,872
[45] Dec. 25, 1973

[54] ANALOG-TO-DIGITAL CONVERSION FOR PROCESSING WIDE-RANGE AND NON-LINEAR INPUT SIGNALS

[75] Inventors: George J. Frye; Arnold M. Frisch, both of Portland, Oreg.

[73] Assignee: Elektros, Inc., Tigard, Oreg.

[22] Filed: Sept. 11, 1972

[21] Appl. No.: 287,627

[52] U.S. Cl. .......................................... 340/347 AD
[51] Int. Cl. .......................................... H03r 13/00
[58] Field of Search .............. 340/347 AD, 347 WT

[56] References Cited

UNITED STATES PATENTS

| | | | |
|---|---|---|---|
| 3,124,794 | 3/1964 | Patmore | 340/347 AD |
| 3,582,777 | 6/1971 | Wunderman | 340/347 NT |
| 3,569,954 | 3/1971 | Glorioso | 340/347 AD |
| 3,273,013 | 9/1966 | Shepard | 340/347 AD |
| 2,796,314 | 6/1957 | Bishop | 340/347 AD |

*Primary Examiner*—Thomas A. Robinson
*Attorney*—Daniel P. Chernoff et al.

[57] ABSTRACT

An analog-to-digital converter for processing non-linear input signals which may vary over several orders of magnitude. In order to speed up signal processing time, the digital output signals of the converter are limited to a representation of a single significant digit and an exponent, indicative of the order of magnitude of the digit. The converter is of the range-stepping sequential comparison type in which the input analog signal is compared with a staircase waveform signal of predetermined incremental amplitude stepped by a decade counter. A series of binary counters triggered sequentially at the completion of each decade by the decade counter control associated gates which, through the use of respective summing resistors and DC offset signal levels, adjust the amplitude of steps within the respective decades so that the digitized output of the converter may be fitted to a straightline approximation of a non-linear function in a manner which compensates for both the non-linearity and order of magnitude of the input signal to be converted.

18 Claims, 3 Drawing Figures

ANALOG-TO-DIGITAL CONVERSION FOR PROCESSING WIDE-RANGE AND NON-LINEAR INPUT SIGNALS

BACKGROUND OF THE INVENTION

This invention relates to analog-to-digital conversion devices and, more particularly, to analog-to-digital converters for handling wide-range, non-linear input signals.

One of the methods well known to the art for converting an analog voltage level to a form of digital word is the sequential comparison technique. In this known method, a digital word is generated and a digital-to-analog converter is used to produce an analog voltage level which corresponds to the particular word generated. This analog voltage level is in turn compared to the input analog signal whose conversion to digital form is sought. If the analog voltage level generated by the word is below that of the input analog signal, no comparator output is produced and the digial word generator then steps up to the next higher level. Another comparison of the analog voltage level generated by the new word to that of the input signal is then made, and this comparison and stepping process is repeated until a word is reached whose analog level is slightly greater than the input analog signal, whereupon the word stepping process is stopped at this level whose digital word then corresponds to the level of the input signal.

Analog-to-digital converters of the aforementioned sequential comparison type which are presently known to the art are linear devices; that is, the incremental magnitude of each word-generated level to which the input signal is compared is constant throughout the range of the device. Consequently, the handling input analog signals which may vary over more than one order of magnitude considerable processing time is required for such linear-type converters to step throughout the range involved. In an effort to overcome this limitation and speed-up the conversion process it has been proposed in the art, as shown for example in Sink U.S. Pat. No. 2,775,754, to provide in a linear type converter a plurality of independent comparison circuits for each order of magnitude which operate on the input signal simultaneously. However, such an approach, involving in effect multiple converters, requires a relatively large number of circuit components with attendant increased cost of manufacture.

Moreover, in several common measuring transducer applications the input analog signal which is to be converted does not exhibit a linear relationship to the physical phenomena which it is monitoring. As an illustrative example, one such transducer device which exhibits a non-linear characteristic is a thermo-couple vacuum gauge in which, typically, its output is related to pressure levels extending over three orders of magnitude, the first and third orders each occupying only 15 to 25 percent of the total voltage swing of the gauge, and the second order encompassing perhaps 50 to 70 percent of the overall voltage range. In utilizing such non-linear transducer devices it is conventional to couple the output to a conversion amplifier whose characteristics are tailored to match the transducer in a manner which linearizes the resultant response which may then be applied to a linear analog-to-digital converter to provide direct digital readings of the measured phenomenon. However, it is very difficult to attain the requisite stability in conventional conversion amplifiers having the desired non-linear characteristics to match up with an associated transducer. Furthermore, the digitized output of such a converter combination, when displayed to three significant digits so as to cover the three decades of range of the monitored physical phenomenon, is both time-consuming to obtain and potentially misleading as the accuracy of the sensing transducer is rarely better than to a single significant figure.

As a consequence prior art analog-to-digital converter devices for processing non-linear signals which may vary over several ranges of magnitude are either slow, or if fast then they are inordinately complex, and, in either event, in many applications they provide output signals purportedly indicative of two or more significant digits of information when the input signal being converted is only representative of a single significant digit and the appropriate order of magnitude involved.

SUMMARY OF THE PRESENT INVENTION

The present invention overcomes the aforementioned limitations of prior converters by recognizing that, in many applications, it is usually not necessary, and in fact would be misleading, to provide as the digitized output of the converter more than one significant figure accuracy when operating on certain types of widely-varying non-linear input signals. In the example mentioned previously, the thermocouple vacuum gauge, the characteristics of the gauge are such that one digit pressure readings might typically represent the outside limit of the transducer's accuracy. Accordingly, the analog-to-digital converter operating on the signal from such a low-resolution transducer need only generate an output representative of that one significant figure and its associated order of magnitude.

In the present invention an apparatus is provided, with appropriate decoding circuits, to generate digitized output signals from the converter which represent, for an input analog signal which may vary over several orders of magnitude, only the most significant figure in the reading and an exponent indicative of the order of magnitude in standard scientific notation. Thus, for example, in the case of the vacuum pressure gauge, illustrative readings generated by the converter in the three decades of range covered by the gauge would be:

| Decade | Digit | Exponent | Interpretation |
|---|---|---|---|
| 1st (lowest) | 2 | 3 | $2\times10^{-3}$ torr (or .002 torr) |
| 2nd | 5 | 2 | $5\times10^{-2}$ torr (or .05 torr) |
| 3rd (highest) | 3 | 1 | $3\times10^{-1}$ torr (or .3 torr) |

It is readily apparent that, if conventional analog-to-digital converters of the sequential comparison type were used to effect the conversion, the counting times for determining readings in the second and third orders of magnitude (decades) would require 10 and 100 times, respectively, as much as that of the first, since each step advance of a higher decade would necessitate a search through the entire range of all lower decades.

In order to reduce the counting time required for the two highest orders of magnitude, this invention takes advantage of the limited resolution requirement for this application by making only ten comparisons for each order of magnitude of the monitored physical phenomenon. In the example given of the vacuum pressure gauge, the circuit first steps from 0 to 0.009 in nine increments. Then it resets and steps from 0 to 0.09. Likewise, the last ten steps are worth 0.1 each, and the circuit steps from 0 to 0.9. Since only ten comparisons are made for each decade of pressure magnitude, the counting times for the second and third orders of magnitude are the same as that of the first order of magnitude. Thus, the counting time for this invention merely increases arithmetically with its output order of magnitude, whereas the counting time of a conventional analog-to-digital converter of the sequential comparison type rises by a factor which increases exponentially with the order of magnitude of its digital output word.

As a concomitant of the technique used in this invention to speed-up analog-to-digital conversion, a simplified and expedient means of compensating for non-linear input signals is provided. A series of straight-line approximations are made of the appropriate calibration curve so that each straight line corresponds to a decade of the monitored physical phenomenon. The comparison circuitry of the converter is designed so that the amplitude of each set of nine step increments in a decade range (corresponding to each set of ten comparisons per decade made with the input signal level) is adjustable, that is, weighted. If the input signal were linear, the step increments for each decade set of ten comparisons would be changed at the transition from one decade to the next higher decade by a constant factor of ten. For a non-linear input signal, the adjustability of the decade increment permits the output characteristic of the converter to be fitted, by a series of straight-line approximations, to the transfer characteristic curve of the gauge or other transducer device responsive to the physical phenomenon being monitored. For example, in the case of an input analog signal which might vary over three orders of magnitude in range, three straight-line approximations can be employed to fit the digitized converter response to the curve of the input analog signal characteristic, with the incremental steps within a decade weighted accordingly. That is, the increment amplitude for the first decade of ten comparisons can be weighted so that these steps follow the straight-line of the approximation corresponding to the first decade. The increment amplitude for the second decade of 10 comparisons can be weighted and offset such that the second 10 comparisons follow the second line of approximation. Likewise the third increment amplitude is weighted and offset so that the ten comparisons corresponding to the third order of pressure magnitude follow the straight-line of the approximation. Even though the electrical signal input to this analog-to-digital converter is not directly proportional to the magnitude of the monitored physical phenomenon, the digital output of the converter will be directly proportional to that magnitude. Thus, a non-linear input signal may be processed just as easily as a linear input signal and the same circuitry, without need for complex decoding, provides a display of the first significant digit and an exponent.

It is therefore a principal objective of this invention to provide a novel and improved method and apparatus for increasing the rate of conversion of a sequential comparison type analog-to-digital converter where a signal resulting in a wide range digital output is to be processed.

It is another objective to provide a method and apparatus for converting an analog electrical signal indicative of a monitored physical phenomenon into a digital form representing only the first significant digit and the order of magnitude of the monitored phenomenon which finds particular application in situations where the information content of the analog signal is generally accurate to only a single significant digit of the monitored phenomenon.

It is a principal feature of the present invention to provide a novel compensating circuit in a digital-to-analog converter which enables the digital output thereof to be matched by straight-line approximations to the non-linear transfer characteristic of a transducer monitoring a physical phenomenon.

It is a further feature of this invention to provide in such a converter a display of only one digit and an exponent corresponding to the order of magnitude of the monitored physical phenomenon.

It is a particular objective to provide an inexpensive instrument which acts in conjunction with an electrical transducer to rapidly produce a digital display of the value of the physical parameter sensed by the transducer.

The foregoing and other objectives, features, and advantages of the invention will be more readily understood upon consideration of the following detailed description of the invention, taken in conjunction with the accompanying drawings.

DESCRIPTION OF THE PREFERRED EMBODIMENT

Figure 1:
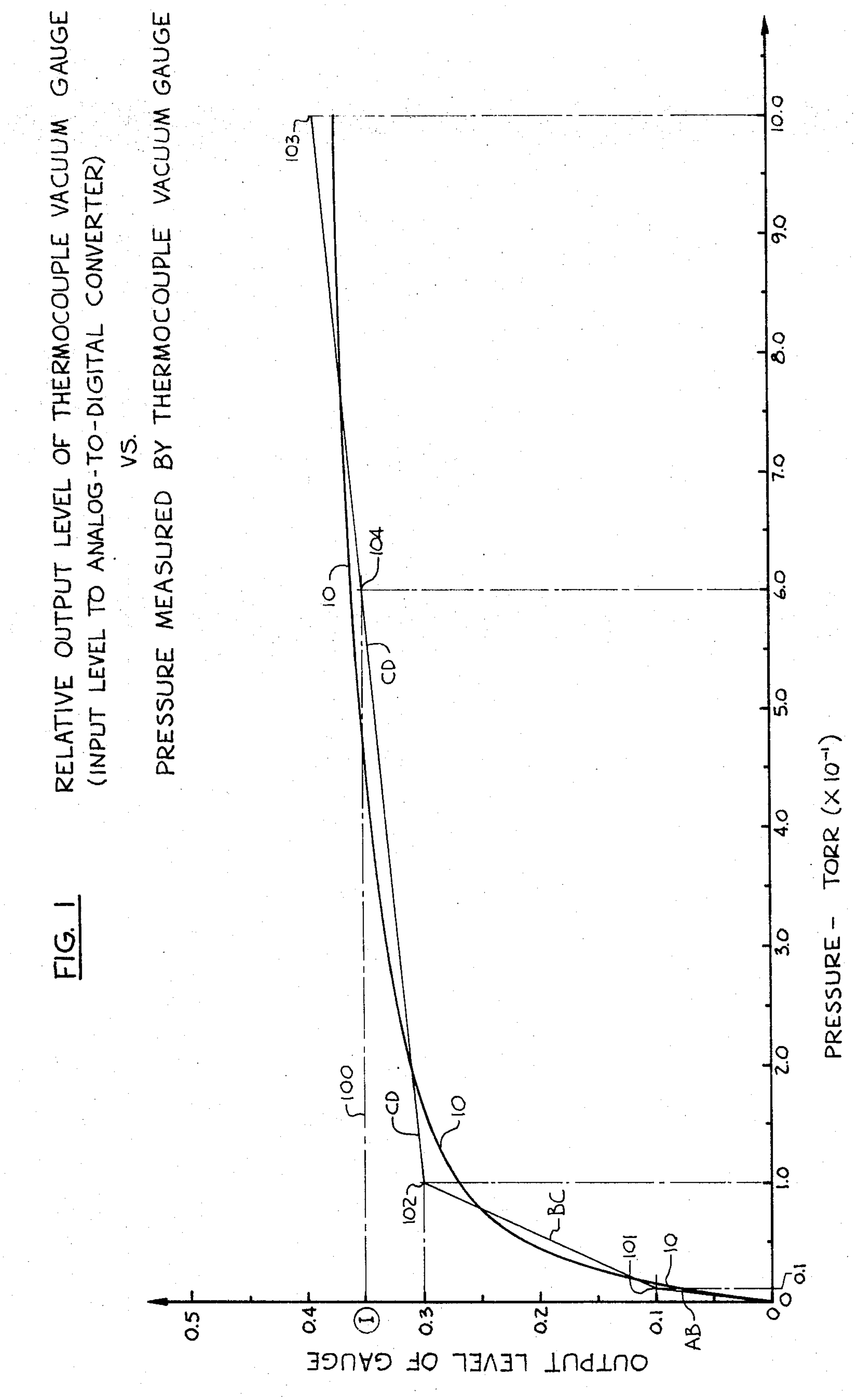
FIG. 1 is a graph of a typical response characteristic of a thermocouple vacuum gauge which is useful as an illustrative aid in the understanding of the non-linear compensation features of the present invention.

To understand a typical application in which a wide-range analog-to-digital converter according to the present invention would be used, consider the curve of FIG. 1 showing by way of example the response characteristic of a thermocouple vacuum gauge monitoring the pressure in an enclosed chamber under vacuum. The output level of the thermocouple vacuum gauge as a function of the monitored pressure is represented by the curve 10. Straight-line approximations of that curve over its three decades of operative range are formed by the three lines AB, BC and CD. (Preferably, the straight-line approximations would be fitted so as to average out or distribute, as nearly as practical, plus and minus difference errors with respect to the actual curve 10.) Line AB approximates the curve from the origin, at which the pressure is zero, to the point 101 at which the pressure is equal to $1 \times 10^{-2}$ Torr. Line BC approximates the curve from the point 101 to the point 102 representing $1 \times 10^{-1}$ Torr. Similarly line CD approximates the curve from point 102 to point 103 (1 × 10 or 1 Torr.).

Over the first decade of the digital output signal of the analog-to-digital converter, the comparison circuitry of the converter which is of the sequential comparison type referred to previously generates a staircase, or incremental stepped, signal which follows line AB; that is, the amplitude of each incremental level of the staircase signal progresses along points located on line AB to provide the digital output of the device. In the second decade the staircase signal steps along line BC. Finally, the staircase signal follows line CD during the third decade of the converter output.

If the input analog signal level were, for example, equal to the relative level 0.35, represented by the ordinate line 100, then the analog-to-digital converter would internally generate a series of digital signals starting at zero output and stepping along line AB until the point 101 corresponding to the digital output $1 \times 10^{-2}$ Torr. is reached. At that point the internally-generated digital comparison signals would move along line BC until the output reached $1 \times 10^{-1}$ Torr. at the point 102. Finally, the stepped signals would move along line CD until the output of the converter reached point 104 indicating $6 \times 10^{-1}$ Torr. on the abcissa. At this point, which corresponds to the intersection with the line 100 representing input analog level 0.35, the comparison circuitry would cease stepping, and the output digital word level corresponding to $6 \times 10^{-1}$ Torr. would be held and supplied for display.

Figure 2:
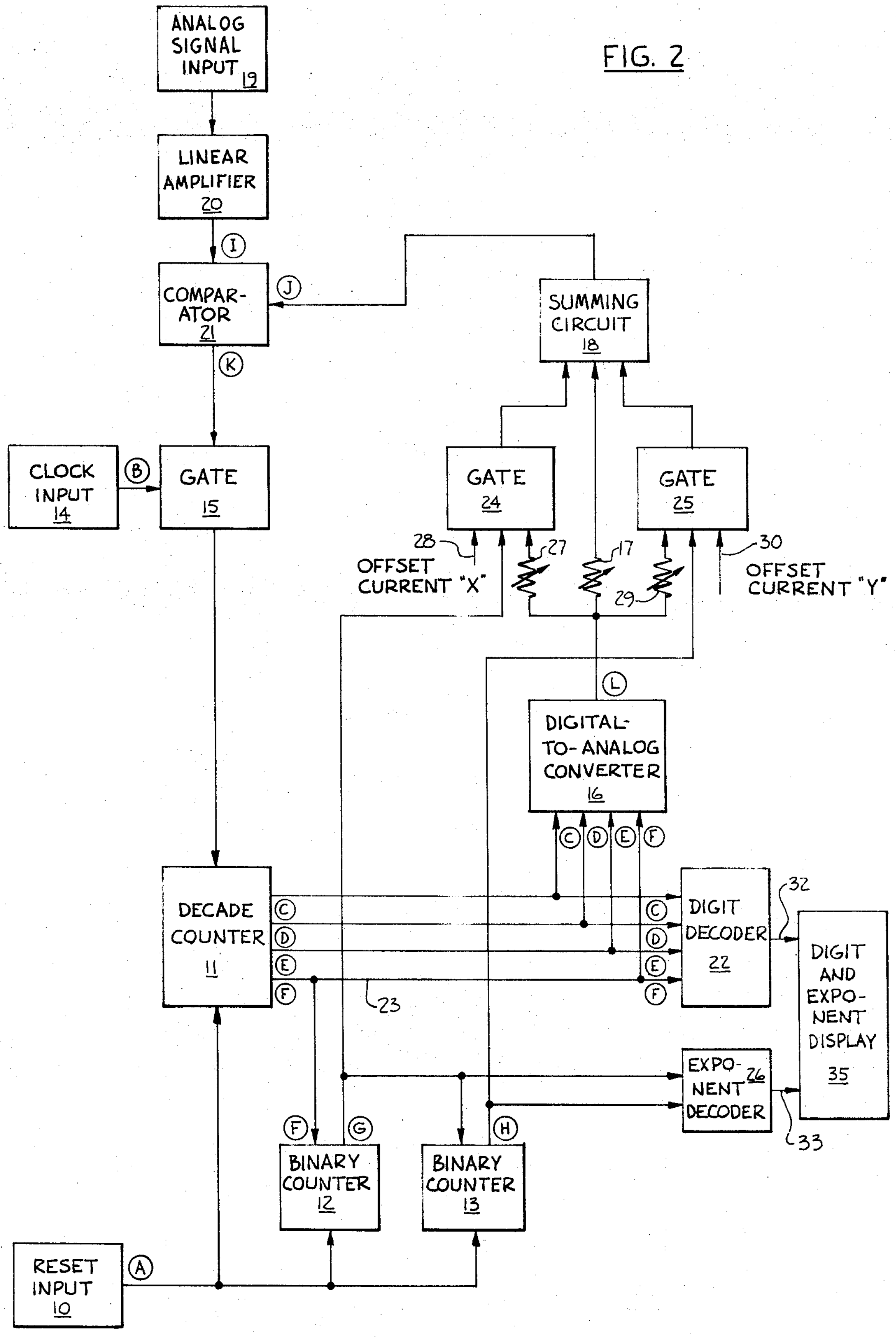
FIG. 2 is a block diagram of an analog-to-digital converter according to the principles of the present invention.
Figure 3:
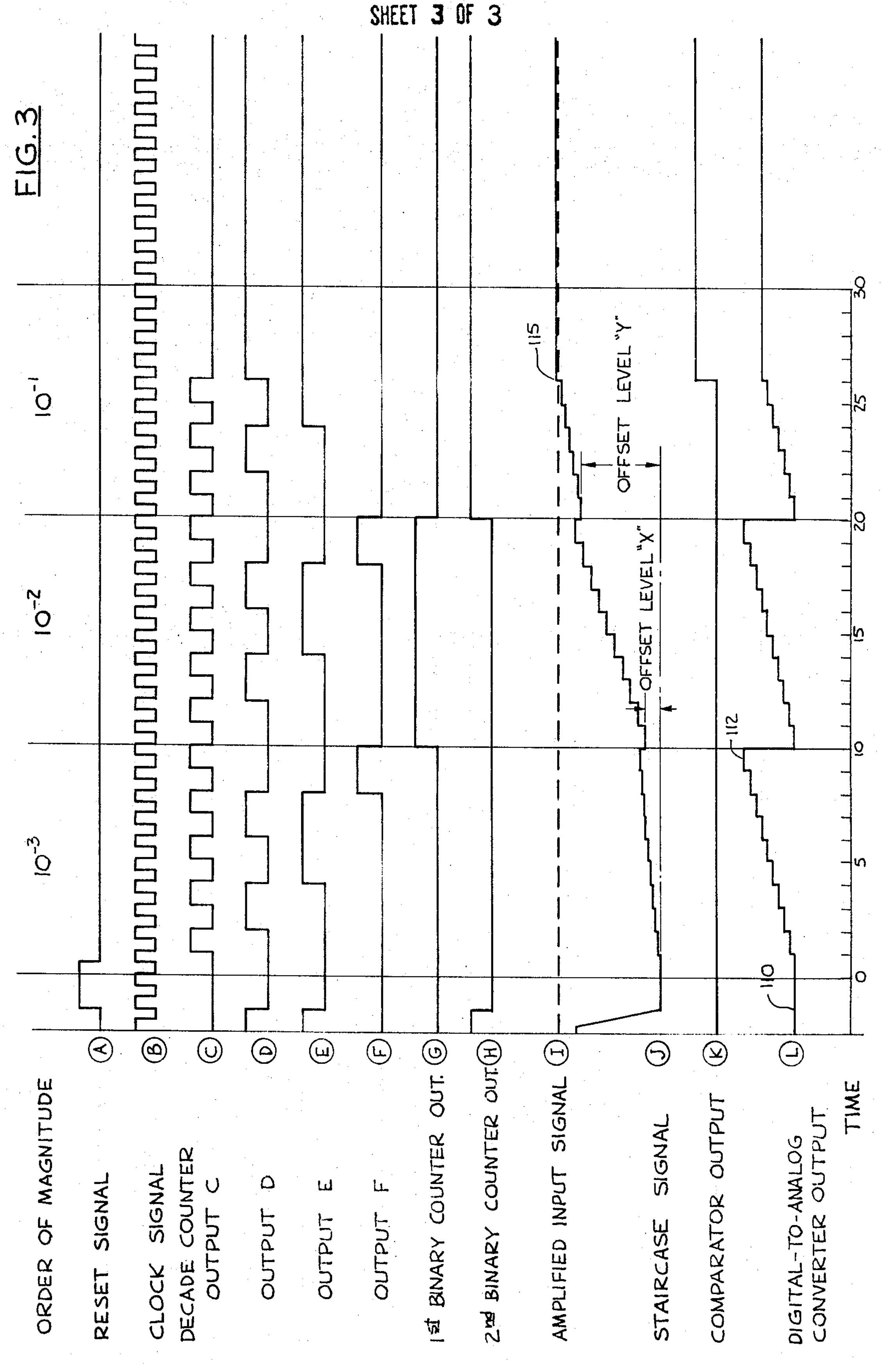
FIG. 3 is a series of waveforms (A through L) on a parallel time scale, representing signals at various points in the circuitry shown in FIG. 2.

Referring now to FIGS. 2 and 3 which comprise, respectively, a block diagram of an exemplary embodiment of the invention and a series of illustrative waveforms on a common time-axis taken at various points in the circuitry, it will be seen that the analog-to-digital conversion process begins when a reset pulse A is applied at 10 to reset decade counter 11 and binary counters 12 and 13 to logical zero. The output B of clock 14 steps decade counter 11 from zero to nine in steps of one as long as gate 15 conducts. Digital-to-analog converter 16 is driven by the BCD (binary coded decimal) outputs C . . . F of decade counter 11. This causes digital-to-analog converter 16 to generate a staircase signal L at its output.

Digital-to-analog converter 16 has 10 output levels equally spaced between the first or minimum level 110 and the tenth or maximum level 112, each of which levels corresponds respectively to a number in the sequence of 10 numerical values generated by the decade counter 11. This staircase output L of digital-to-analog counter 16 is supplied through a first weighting resistor 17 to provide the proper current level to the summing circuit 18 when the analog-to-digital converter steps through its first decade or counting cycle.

The analog signal 19 to be converted is applied to linear amplifier 20 resulting in an amplified signal I which is supplied as one input of comparator 21. The other input of comparator 21 is derived from summing circuit 18 which provides the modified staircase signal J against which the input signal I is compared. Comparator 21 provides a stop command signal K when the output J from summing circuit 18 becomes greater than the output I from linear amplifier 20, as shown at point 115 of FIG. 3, thereby indicating substantial parity between the two compared signals and causing gate 15 to stop conducting which halts the stepping of decade counter 11. The four outputs C . . . F of decade counter 11 are also connected to the input of digit decoder 22 which produces, on lead 32, when the stepping of the counter is halted, an output signal for display on readout means 35 which is the significant digit of the digital word corresponding to the input analog signal.

Turning now to the means for determining the order of magnitude or decade of the input signal 19, output F of decade counter 11 is also supplied to a first binary counter 12. When this signal F falls from a logical one to a logical zero when occurs when the counter completes a decade of counting, the output G of binary counter 12 changes state. The output of first binary counter 12 is also supplied to a second binary counter 13 which changes its output H from zero to one whenever binary counter 12 changes its output from one to zero. For the first cycle of the decade counter 11, corresponding to the first order of magnitude for the digital output of the converter device, both binary counters 12 and 13 after first having been reset by reset means 10, retain a zero at their outputs and both gates 24 and 25 connected respectively thereto remain non-conducting. Upon completion of the first decade of counting, the output signal F of the decade counter causes first binary counter 12 to change states to a logical one. Thereupon, during the second cycle of the decade counter, or the second order of magnitude, first binary counter 12 exhibits a one and gate 24 conducts. Upon completion of the second decade of the count, first binary counter 12 is changed back to zero by decade counter signal F, and second binary counter 12 is changed to the logical one state. Thereupon, during the third cycle of the decade counter, or the third order of magnitude, first binary counter 12 exhibits a zero and gate 24 is non-conducting, while second binary counter 13 exhibits a one and gate 25 is conducting. From this signal information exponent decoder 26, connected to the respective outputs of binary counters 12 and 13, will produce a display signal corresponding to the appropriate order of magnitude for the digital signal representative of the input analog voltage level. The output of the exponent decoder is then supplied over lead 33 to the read-out means 35 for display.

Consider now the means by which the staircase signal L is properly weighted over the several decades of the converter's range. During the first cycle of the decade counter 11, when both gates 24 and 25 are non-conducting, the output of the digital-to-analog converter 16 is supplied to summing circuit 18 thorugh only a single weighting resistor 17. As there is but a single input to the summing circuit it is passed through without change as the input J to the comparator 21. When gate 24 is rendered conducting during the second cycle of counting of the decade counter 11, the output of the digital-to-analog converter 16 is supplied to the summing circuit 18 through both weighting resistor 17. This causes the step size of the modified staircase signal J to be changed during this cycle, as compared to the first cycle, since additional current, determined by weighting resistor 27, flows from digital-to-analog converter 16 to the summing circuit 18. In addition, summing circuit 18 is also supplied during this second decade cycle with a DC offset current 28. This constant offset current serves as a base level to raise the first step of the set of steps forming the second order of magnitude to an appropriate level X (see waveform J). (This base level should be slightly lower in magnitude than the last step of the set of ten steps forming the previous decade in order to ensure that the converter advances properly in counting the steps forming the second decade.) Likewise, when gate 25 is conducting during the third cycle of counting of the decade counter, summing circuit 18 is supplied with a different offset current 30 and the stepped signal current generated by the digital-to-analog converter 16 is supplied to the summing circuit through a different weighting resistor 29. Offset current 30 provides the base level Y (again lower in magnitude than the last step of the previous decade) for the step of steps forming the third order of magnitude.

In the above manner weighting resistors 17, 27, and 29 are used to determine the incremental step sizes for the sets of steps forming the first, second, and third orders of magnitude of the digitized converter output, respectively. These weighting resistors, together with offset currents 28 and 30, are selected and adjusted, respectively, to provide the best straight-line approximations to the non-linear characteristics of the input analog signal source. In the arrangement described, each straight-line section of the approximation corresponds to an order of magnitude or decade of the digital output.

From the foregoing description it will be apparent to those skilled in the art how the apparatus shown in FIG. 2 operates to convert an input analog signal to a digital word consisting of one digit and an exponent, and how compensation can be provided for a possible non-linear characteristic of such input signal.

Although an exemplary circuit and application have been disclosed and discussed, it should be understood that these examples are not set forth as limitations on the scope of the invention and other applications and circuit configurations may not necessarily depart from the concepts of this invention. In particular, it will be apparent to those skilled in the art that the decade ranges of this analog-to-digital converter can readily be extended beyond three through straightforward extrapolation by providing additional binary counters, gates and associated logic circuitry.

The terms and expressions which have been employed in the foregoing abstract and specification are used therein as terms of description and not of limitation, and there is no intention, in the use of such terms and expressions, of excluding equivalents of the features shown and described or portions thereof, it being recognized that the scope of the invention is defined and limited only by the claims which follow.

What is claimed is:

1. A method of converting a non-linear analog signal representative of a monitored physical parameter into a digital signal representative of the value of said physical parameter, comprising the steps of:

a. generating a staircase signal which starts at a reference amplitude level and increases sequentially in stepped increments, with said increments being grouped into sets of consecutive, equally-spaced amplitude levels, b. adjusting the spacing between incremental levels in each set in said staircase signal to approximate the non-linear response characteristic of said analog signal to said monitored physical parameter, c. comparing the amplitude of said analog signal to the amplitude of said stepping staircase signal and, based on such comparison, holding said staircase signal at the incremental amplitude level which is nearest the amplitude of said analog signal, and d. thereupon generating a digital signal output corresponding to the held level of said staircase signal.

2. The method of claim 1 comprising the further steps of displaying said digital signal output in scientific notation form comprising a decimal number corresponding to the first significant digit of the value of said monitored physical parameter and an exponent number representative of the order of magnitude of said digit.

3. The method of claim 1 wherein there are 10 incremental amplitude levels in said sets.

4. The method of claim 1 wherein said stepping staircase signal is generated, starting from zero amplitude, by providing a first group of steps having a first incremental amplitude spacing and thereafter providing a second group of steps having a second incremental amplitude spacing, said second set being superimposed on a first base amplitude level.

5. The method of claim 4 further characterized in that the generation of said staircase signal beyond the last step of said second group is provided by a third group of steps having a third incremental amplitude spacing, said third set being superimposed on a second base amplitude level.

6. A method of converting an analog signal, representing a value which may vary non-linearly over a range of more than one order of magnitude, into a digital signal comprising the steps of:

a. deriving a digital signal substantially corresponding to said value, and b. displaying said digital signal in a form comprising a decimal number corresponding to the first significant digit of said value and a number representative of the order of magnitude of said digit.

7. Apparatus for converting a non-linear analog signal, representing the value of a monitored physical parameter, into a digital signal corresponding to said value comprising:

a. generator means, including a digital counter coupled to a digital-to-analog converter, for generating an analog staircase signal which increases sequentially in stepped incremental levels, b. means for grouping said incremental levels into spaced sets of consecutive, equally-spaced amplitude levels, c. means for adjusting the spacing between incremental levels within each set of said staircase signal to approximate the non-linear response characteristic of said analog signal to said monitored physical parameter, d. comparator means for comparing the amplitude of said analog signal to be converted to the amplitude of said staircase signal and generating an output signal when substantial parity between the two signals is reached, said comparator output signal causing said digital counter to cease counting and to hold its output at the digital value which produces substantial parity in said comparator, and e. read-out means for displaying a numerical representation of said counter output.

8. The converter apparatus set forth in claim 7 further characterized in that said numerical representation displayed by said read-out means comprises a decimal number corresponding to the first significant digit of the value of said monitored physical parameter and a number representative of the order of magnitude of said digit.

9. The converter apparatus of claim 7 wherein said means (c) for adjusting the spacing between incremental levels within a set comprises selectable resistor means connecting the output of said digital-to-analog converter to a summing circuit, and said means (b) for grouping said incremental levels into spaced sets comprises selectable current levels of predetermined amplitudes connected to said summing circuit.

10. The converter apparatus set forth in claim 8 wherein said digital counter is a decade counter and said number displayed by said read-out device which is representative of the order of magnitude of said first significant digit is derived by circuit means for counting the number of decade cycles said digital counter means completes before an output signal is produced by said comparator means.

11. The converter apparatus of claim 10 wherein said circuit means for counting the decade cycles of said digital counter controls the selection of said resistor means and said current levels associated with a respective decade of said digital counter.

12. The converter apparatus of claim 11 further provided with means for resetting to zero said digital counter and said circuit means for counting the decade cycles of said counter.

13. An apparatus for converting an analog signal, representing a value which may vary non-linearly over a range of more than one order of magnitude, into a digital signal comprising:

a. means for deriving a digital signal substantially corresponding to said value, and b. read-out means for displaying said digital signal in scientific notation form comprising a decimal number corresponding to the first significant digit of said value and an exponent number representative of the order of magnitude of said digit.

14. Apparatus as set forth in claim 13 wherein said decimal number corresponding to said first significant digit is generated by means which include a staircase signal generator, and a comparator for comparing the respective amplitudes of said staircase signal generator and said analog signal.

15. Apparatus as set forth in claim 14 wherein said staircase generator provides an output signal which increases sequentially in stepped increments from a reference level, with said increments being grouped into sets, and said exponent number is determined by the provision of means for counting the number of completed sets occurring in said staircase signal generator before substantial parity between the compared signals is reached in said comparator.

16. Apparatus for converting an analog signal representing a monitored value which may vary over a range of more than one order of magnitude into a digital signal comprising:

a. staircase generator means for producing an analog signal which increases sequentially in stepped incremental levels;

b. means for grouping said incremental levels into a plurality of consecutive sets of equally-spaced sequentially-incrementing amplitude levels;

c. comparator means for comparing the amplitude of said analog signal to be converted to the amplitude of said sequentially-increasing amplitude level and producing an output signal when substantial parity between the two amplitudes is reached;

d. first digital counter means for counting said incremental levels within each respective set of amplitude levels as sequentially produced by said generator means until said comparator output signal has been generated;

e. second digital counter means for counting the number of said sets of amplitude levels produced by said generator means until said comparator output signal has been generated; and f. readout means for displaying both the output of said first digital counter as a decimal number corresponding to the first significant digit of said monitored value and the output of second digital counter as a decimal number corresponding to the order of magnitude of said monitored value.

17. Apparatus set forth in claim 16 further provided with means for varying the rate of increase of said incremental levels for each respective set of amplitude levels.

18. Apparatus set forth in claim 17 further provided with means to dynamically select a different predetermined rate of increase of said incremental level for each respective set of amplitude levels.

* * * * *

UNITED STATES PATENT OFFICE
CERTIFICATE OF CORRECTION

Patent No. 3,781,872 Dated Dec. 25, 1973

Inventor(s) George J. Frye and Arnold M. Frisch

It is certified that error appears in the above-identified patent and that said Letters Patent are hereby corrected as shown below:

| | |
|---|---|
| Col. 1, Line 20 | Change "digial" to --digital--. |
| Col. 1, Line 35 | Change "the" to --in--. |
| Col. 4, Line 60 | Change "1 x 10" to --1 x $10^0$--. |
| Col. 6, Line 2 | Change "when" (first occurrence) to --which--. |
| Col. 6, Line 22 | Change "12" to --13--. |
| Col. 6, Line 40 | Change "thorugh" to --through--. |
| Col. 7, Line 3 | Change "step" to --set--. |

Signed and sealed this 6th day of August 1974.

(SEAL)
Attest:

McCOY M. GIBSON, JR.
Attesting Officer

C. MARSHALL DANN
Commissioner of Patents

M PO-1050 (10-69)

USCOMM-DC 60376-P69
☆ U.S. GOVERNMENT PRINTING OFFICE : 1969 O—366-334